US011179730B2

(12) United States Patent
Guerry et al.

(10) Patent No.: US 11,179,730 B2
(45) Date of Patent: Nov. 23, 2021

(54) METHOD FOR MANUFACTURING AN ELECTRO-FILTER

(71) Applicant: AKWEL SA, Champfromier (FR)

(72) Inventors: Pascal Guerry, Seppois-le-Haut (FR); Anthony Nollevaux, Champfromier (FR); Ludovic Serrurier, Montreal la Cluse (FR)

(73) Assignee: AKWEL, Champfromier (FR)

( * ) Notice: Subject to any disclaimer, the term of this patent is extended or adjusted under 35 U.S.C. 154(b) by 564 days.

(21) Appl. No.: 16/013,212

(22) Filed: Jun. 20, 2018

(65) Prior Publication Data

US 2018/0361398 A1 Dec. 20, 2018

(30) Foreign Application Priority Data

Jun. 20, 2017 (FR) ..................................... 17/55613

(51) Int. Cl.

| | |
|---|---|
| ***H05K 13/00*** | (2006.01) |
| ***B03C 3/45*** | (2006.01) |
| ***F01N 3/08*** | (2006.01) |
| ***F01M 13/04*** | (2006.01) |
| ***F01N 3/01*** | (2006.01) |
| ***B03C 3/47*** | (2006.01) |
| ***B03C 3/12*** | (2006.01) |

(52) U.S. Cl.

CPC .................. *B03C 3/45* (2013.01); *B03C 3/12* (2013.01); *B03C 3/47* (2013.01); *F01M 13/04* (2013.01); *F01N 3/01* (2013.01); *F01N 3/0892* (2013.01); *B03C 2201/30* (2013.01); *F01M 2013/0466* (2013.01)

(58) Field of Classification Search

CPC .... B03C 3/12; B03C 3/45; B03C 3/47; B03C 2201/30; F01N 3/01; F01N 3/0892; F01M 13/04; F01M 2013/0466

See application file for complete search history.

(56) References Cited

U.S. PATENT DOCUMENTS 4,771,824 A * 9/1988 Rojey ....................... F28F 1/24 165/104.13
6,616,817 B1 9/2003 Schumann et al.
(Continued)

FOREIGN PATENT DOCUMENTS

FR 3 026 660 A1 4/2016
JP 2009-8096 A 1/2009
WO 02/089990 A1 11/2002

*Primary Examiner* — Paul D Kim
(74) *Attorney, Agent, or Firm* — Oliff PLC

(57) ABSTRACT

A method for manufacturing an electro-filter for separating a mixture of gas and oil drops including: at least one body including at least one oil/gas separation chamber, at least one emitter electrode, and at least one collector electrode made of an electrically-conductive plastic material. The manufacturing method includes at least the following steps: implementation of a first injection cycle having at least one step of injecting the collector electrode, implementation of an overmolding cycle having at least the following steps: displacement of the injected collector electrode into a second cavity of the same mold or into the cavity of another mold, overmolding at least the oil/gas separation chamber of the body at least on the collector electrode, with an electrically-insulating plastic material.

8 Claims, 6 Drawing Sheets

(56) References Cited

U.S. PATENT DOCUMENTS

Figure 1:
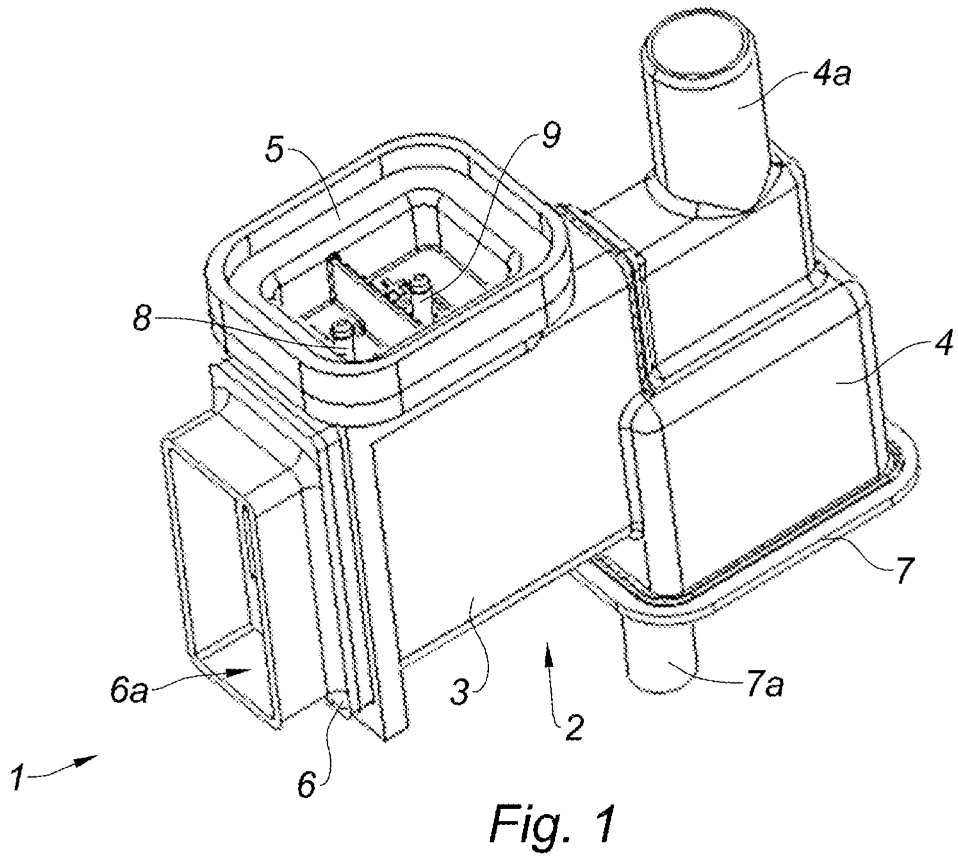

| | | | | |
|---|---|---|---|---|
| 7,105,042 | B2 * | 9/2006 | Tumbrink | B03C 3/12 55/385.3 |
| 9,321,056 | B2 * | 4/2016 | Boehm | B03C 3/12 |
| 9,901,933 | B2 * | 2/2018 | Guerry | B03C 3/14 |
| 2016/0030949 | A1 | 2/2016 | Jameson et al. | |
| 2016/0096183 | A1 | 4/2016 | Guerry et al. | |

* cited by examiner

METHOD FOR MANUFACTURING AN ELECTRO-FILTER

The invention concerns the technical field of separation of oil and gas in a mixture originating from an internal combustion engine of a motor vehicle. By motor vehicle, are meant in particular passenger vehicles, utility vehicles or industrial vehicles such as for example trucks. An internal combustion engine in operation produces crank gases which form an aerosolized mixture comprising in particular oil drops in suspension in a gas. The oil drops originate from the splashing of the connecting rods and of the crankshaft into the oil contained in the crankcase. The gas originates from leakages between the cylinders and the pistons; these leakages are sometimes called "gas blow-by". It is necessary to separate the oil from the gas in order to reinject the oil into the internal combustion engine.

More particularly, the invention concerns the field of systems for separation by electro-filtration called electro-filters. These electro-filters may be integrated to the head cover, and form a separator called "inner" to the head cover or form an independent separator.

There is known from the document FR3026660 A1 an electro-filter comprising a separation chamber, an oil recovery chamber connected to the separation chamber, at least one emitter electrode extending into the separation chamber and one collector electrode extending into the separation chamber, an electronic unit connected to the emitter and collector electrodes and a pressure drop generating member disposed in the separation chamber configured to generate pressure drops when the gas flows between the inlet and the outlet of the separation chamber. The electro-filter presented by this document comprises a plurality of assembled parts, which complicates the manufacture of the latter.

Furthermore, the electrodes which may be either made of plastic materials coated with electrically-conductive materials or completely made of electrically-conductive materials (metals) are positioned in the separation/recovery chambers with some clearance due to mounting, which has the drawback of enabling the infiltration of liquid, for example water, oil, acid, having electric properties different from air at the level of the terminals. The infiltrated liquid may stagnate or migrate along the wires up to the terminals of the generator, which may create an electric current between the terminals of the generator disturbing the operation of the generator and of the electro-filter.

Furthermore, in the case of metal electrodes, oxidation problems may occur.

The invention aims at solving all or part of the aforementioned drawbacks.

An object of the invention is a method for manufacturing an electro-filter for separating a mixture of gas and oil drops originating from an internal combustion engine, said electro-filter comprising:

- at least one body (2) including at least one oil/gas separation chamber (3),
- at least one emitter electrode (8), and
- at least one collector electrode (9) made of an electrically-conductive plastic material, the manufacturing method comprising at least the following steps:

- implementation of a first injection cycle A comprising at least one step a.1 of injecting the collector electrode with an electrically-conductive plastic material into a first cavity of the mold,
- implementation of an overmolding cycle B comprising at least the following steps:
  - b.1 displacement of the injected collector electrode into a second cavity of the same mold or into the cavity of another mold,
  - b.2 overmolding at least the oil/gas separation chamber of the body at least on the collector electrode, with an electrically-insulating plastic material.

The use of conductive plastics at least for the collector electrode allows simplifying the construction and the manufacture of the electrode and of the electro-filter. Preferably, the used conductive plastic material is a material belonging to the family of polyamides or derivatives thereof that is to say any polymer comprising an amide group in its macromolecule, such as the aliphatic polyamides (PA6, PA66, P12, etc.), the polyphthalamide polyamides (PPA), etc. Still more preferably, the used conductive plastic material is a polyamide charged with carbon powder or carbon fibers or a polyamide charged with a metallic powder or metallic fibers.

Furthermore, this use allows saving weight in comparison with metallic electrodes. In addition, since all parts (jumper, connecting wire, electrode) of a plastic electrode are made integrally in one piece, this allows avoiding the problems of faulty contacts between the parts in comparison with metallic electrodes whose parts are assembled. Finally, the risk of oxidation of the plastic electrodes is reduced in comparison with metallic electrodes.

Furthermore, thanks to the overmolding, the manufacturing method according to the invention allows limiting the clearances between the parts in comparison with a conventional assembly and therefore allows promoting the contact of the parts with each other which enhances the sealing between the conductive parts and the insulating parts of the electro-filter and avoiding the conductivity disturbances of the electrodes which might occur if the sealing is defective.

Moreover, thanks to the overmolding and by using the electrically-conductive plastic material, the number of operations for obtaining an end product, in this instance an electro-filter, is drastically reduced.

According to an embodiment of the invention, the overmolding cycle B for forming a first electro-filter is carried out at the same time as the first cycle A of injecting the electrodes intended to the formation of a second electro-filter.

Thus, it is possible to perform one or several injection(s) with a conductive plastic material and an overmolding with an insulating material on parts injected with a conductive plastic, within the same mold with different workstations.

According to an embodiment of the invention, the manufacture of the electro-filter is carried out in a bi-material press comprising at least two extruders, a first extruder being configured for the injection of the electrically-conductive plastic material for example a polyamide charged with carbon fibers and a second extruder being configured for the overmolding with an electrically-insulating plastic material for example a polyamide 66 preferably charged to 30% with glass fibers. Thus, the insulating portion which must resist the mechanical and thermal stresses due to vibrations and to the heat generated by the engine is more resistant thanks to the presence of glass fibers charges within the constituent material.

According to an embodiment of the invention, during a starting phase of the method, an initial injection cycle is operated without an overmolding cycle being implemented at the same time.

According to an embodiment of the invention, the collector electrode comprises two plates connected to each other and made integrally in one piece at step a.1.

More particularly, the plates of the collector electrode are arranged opposite each other and are connected by a top face, on which is preferably arranged the jumper of the collector electrode. In this configuration, the collector electrode has an inverted U-like general shape.

According to another embodiment of the invention, the collector electrode is in the form of an open box deprived of a front face and rear face. More particularly, the two plates of the collector electrode are connected to each other by a top face and a bottom face opposite to the top face. In this other configuration, the collector electrode has an O-like general shape.

The interest of such configurations is to have one single integrally molded part, which is simpler to manufacture.

More particularly, the collector electrode comprises a rear face, two lateral faces corresponding to the two plates, a top face on which is formed a jumper protruding from the top face and a bottom face opposite to the top face. Advantageously, a recess is formed on the top face and opening onto the open face of the collector electrode.

According to an embodiment of the invention, the displacement step b.1 is preferably carried out by a robot.

According to an embodiment of the invention, the emitter electrode is made of an electrically-conductive material such as a metal or an electrically-conductive plastic material. According to an embodiment of the invention, the emitter electrode may comprise a wire or a point.

According to an embodiment of the invention, the first injection cycle A comprises an additional step a.2 of injecting the emitter electrode into a third cavity of the mold or into another mold with an electrically-conductive plastic material.

According to an embodiment of the invention, step a.2 is followed by a step a.3 of removing the injected emitter electrode from the mold in which it has been injected or by a step b.1bis of displacing the injected emitter electrode into the second cavity of the mold.

According to an embodiment of the invention, if the method implements step b.1bis then at the overmolding step b.2, at least the separation chamber is overmolded on the emitter electrode and the collector electrode in the second cavity of the mold.

Advantageously, the overmolding on the two electrodes enables a good repeatability and an accuracy of the relative position of the emitter electrode with respect to the collector electrode. Indeed, it is important to have an electric field symmetrical with respect to a plane of symmetry of the electro-filter in order not to create an ionization phenomenon more significant at one side than the other side. Experimentally, it has been observed that a dissymmetry reduces the breakdown voltage of the electro-filter, which reduces the effectiveness of the electro-filter. The breakdown voltage corresponds to the electric arc occurring at the level of the minimum distance between the two electrodes.

According to an embodiment of the invention, the manufacturing method comprises a second injection cycle C implemented simultaneously or subsequently or anteriorly to the first injection cycle A or to the overmolding cycle B.

According to an embodiment of the invention, the manufacturing method comprises at least one assembly cycle D implemented subsequently at least to the overmolding cycle B.

According to an embodiment of the invention, if the method implements step a.3 then the assembly cycle D comprises at least one step d.1 of assembling the emitter electrode with the overmolded body of the electro-filter. Preferably, step d.1 consists of an assembly by bonding or by welding or by clipping.

According to an embodiment of the invention, the assembly cycle D is carried out outside the mold.

According to an embodiment of the invention, the body of the electro-filter further comprises an oil recovery chamber.

According to an embodiment of the invention, the recovery chamber is made of an electrically-insulating plastic material.

According to an embodiment of the invention, the recovery chamber may be overmolded at step b.2 with the separation chamber unless step b.1bis is implemented.

Alternatively and according to an embodiment of the invention, the second injection cycle comprises a step c.1 during which the separation chamber is injected, step c.1 may be carried out at the same time as any one of the steps of the first injection cycle A or during any one of the steps of the overmolding cycle B.

According to an embodiment of the invention, if the method implements step c.1 then the assembly cycle comprises a step d.2 of assembling the separation chamber with the overmolded body of the electro-filter. Preferably, step d.2 consists of an assembly by bonding or by welding or by clipping.

According to an embodiment of the invention, the body of the electro-filter further comprises a gas inlet connecting part intended to cooperate with a conduit conveying the gas to treat.

According to an embodiment of the invention, the connecting part is made of an electrically-insulating plastic material.

According to an embodiment of the invention, the connecting part comprises an inlet and two branches arranged on either side of the inlet.

According to an embodiment of the invention, the branches of the connecting part are arranged in the separation chamber.

Advantageously, the two branches of the connecting part are placed inside the collector electrode in contact with the top face and the bottom face of the collector electrode, which allows avoiding the top face and the bottom face of the collector electrode collecting the oil drops.

Thus, the oil is collected only on the plates of the collector electrode, which allows controlling the oil collection location by making the collected oil run in the form of a film or trickle by the effect of gravity and the speed of the gas flow on the plates. Thanks to the control of oil collection, it is easier to position the oil outlet orifice.

According to an embodiment of the invention, said gas inlet connecting part may be overmolded at step b.2: with the separation chamber, or with the separation chamber and the recovery chamber.

Alternatively and according to an embodiment of the invention, the second injection cycle C comprises a step c.2 during which the gas inlet connecting part is injected, without being overmolded. Step c.2 may be carried out either at the same time as any one of the steps of the first injection cycle A or during any one of the steps of the overmolding cycle B or at the same time as step c.1.

According to an embodiment of the invention, if the method implements step c.2 then the assembly cycle D comprises a step d.3 of assembling the gas inlet connecting part with the overmolded body of the electro-filter. Preferably, step d.3 consists of an assembly by bonding or by welding or by clipping.

According to an embodiment of the invention, the body of the electro-filter further comprises a housing intended to house a generator intended to be in connection with the emitter and collector electrodes.

According to an embodiment of the invention, the housing is made of an electrically-insulating plastic material.

According to an embodiment of the invention, the housing may be overmolded at step b.2: with the separation chamber, or with the separation chamber and the recovery chamber, or with the separation chamber and the recovery chamber and the gas inlet connecting part.

Alternatively and according to an embodiment of the invention, the second injection cycle C comprises a step c.3 during which the gas inlet connecting part is injected, without being overmolded. Step c.3 may be carried out either at the same time as any one of the steps of the first injection cycle A or during any one of the steps of the overmolding cycle B or at the same time as step c.1 and/or c.2.

According to an embodiment of the invention, if the method implements step c.3 then the assembly cycle D comprises at least one step d.4 of assembling the housing with the overmolded body of the electro-filter. Preferably, step d.4 consists of an assembly by bonding or by welding or by clipping.

According to an embodiment of the invention, the body of the electro-filter further comprises a cap including a treated oil outlet, said cap being configured to close the oil recovery chamber.

According to an embodiment of the invention, the cap is made of an insulating plastic material.

According to an embodiment of the invention, the second injection cycle C comprises a step c.4 during which the cap is injected, without being overmolded. Step c.4 may be carried out either at the same time as any one of the steps of the first injection cycle A or during any one of the steps of the overmolding cycle B.

According to an embodiment of the invention, the cap may be injected during step c.4 either into the same mold as the other parts of the injection cycle A, into another cavity or into a different mold.

According to an embodiment of the invention, if the method implements step c.4 then the assembly cycle D comprises at least one step d.5 of assembling the cap with the overmolded body of the electro-filter. Preferably, step d.5 consists of an assembly by bonding or by welding or by clipping According to an embodiment of the invention, the obtained electro-filter may be either integrated to the head cover or independent from the head over.

More particularly, according to an embodiment of the invention, the walls of the head cover form the body of the electro-filter.

The invention also covers an electro-filter for separating a mixture of gas and oil drops originating from an internal combustion engine, the electro-filter comprising:

a body including at least one oil/gas separation chamber, at least one emitter electrode positioned in the separation chamber of the body, at least one collector electrode positioned in the separation chamber of the body, at least the collector electrode being made of an electrically-conductive plastic material, characterized in that at least the separation chamber of the body is overmolded at least on the collector electrode.

Figure 2:
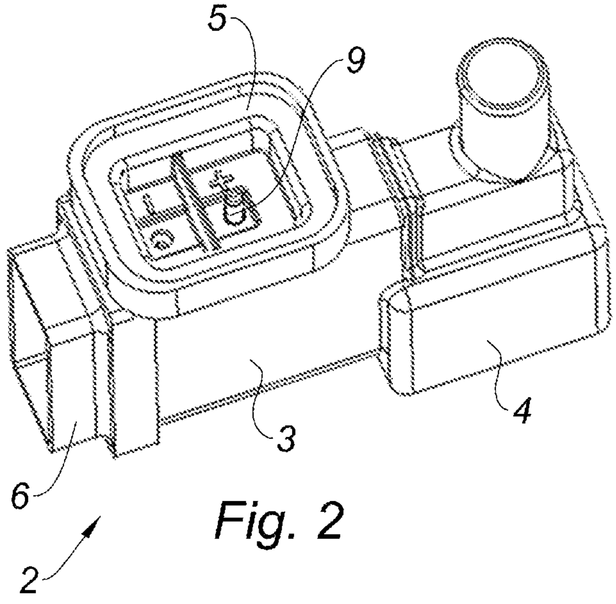
Figure 3:
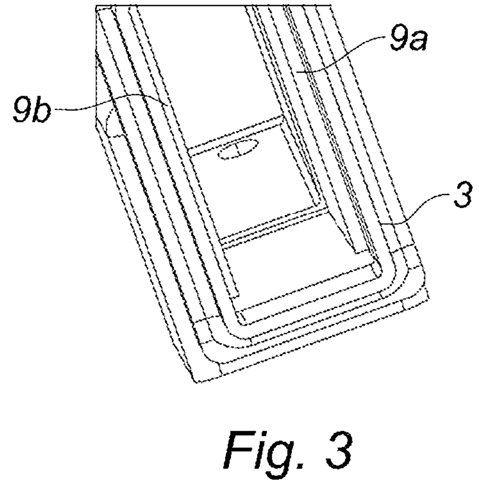
Figure 4:
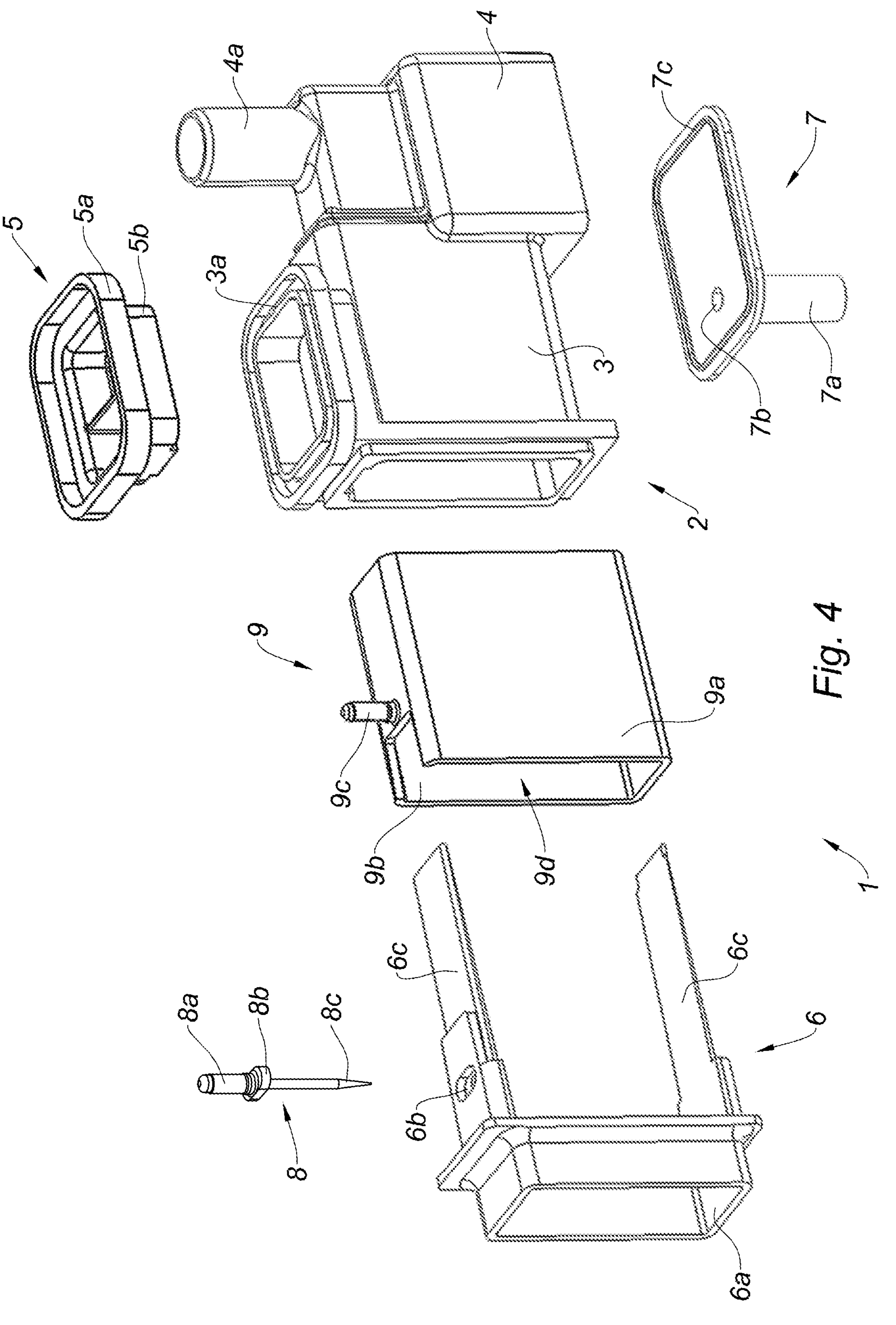
Figure 5:
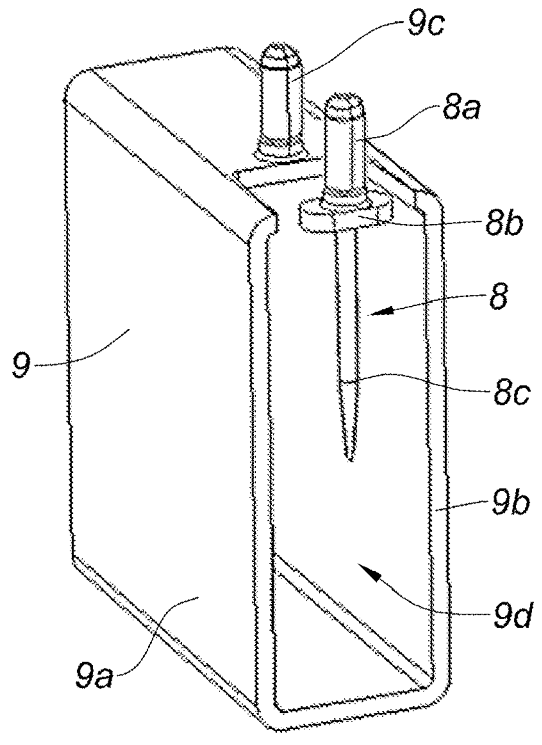
Figure 6:
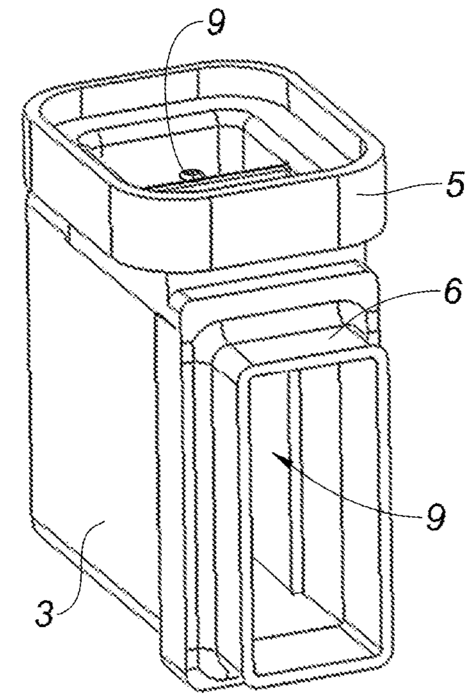
Figure 7:
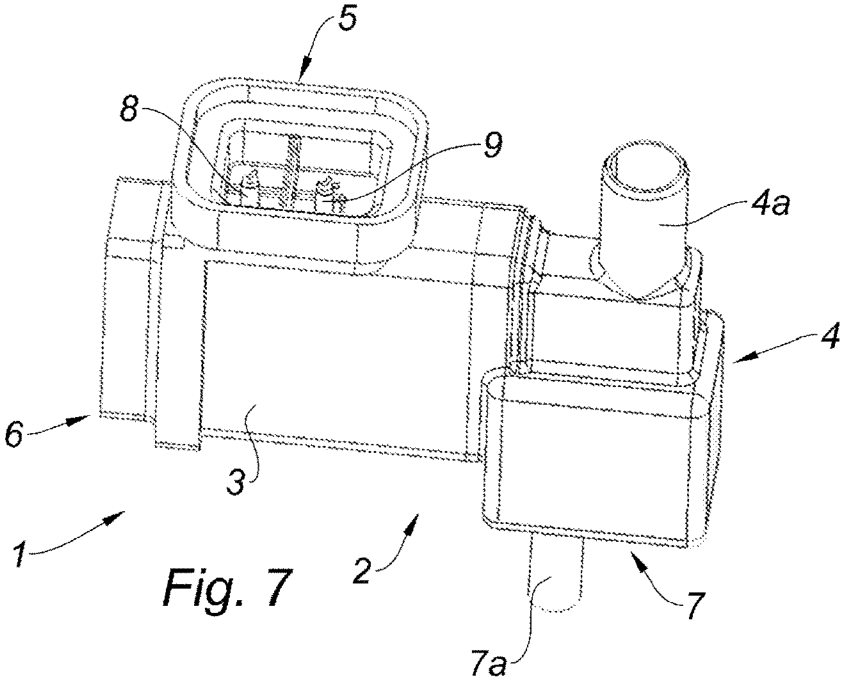
Figure 8:
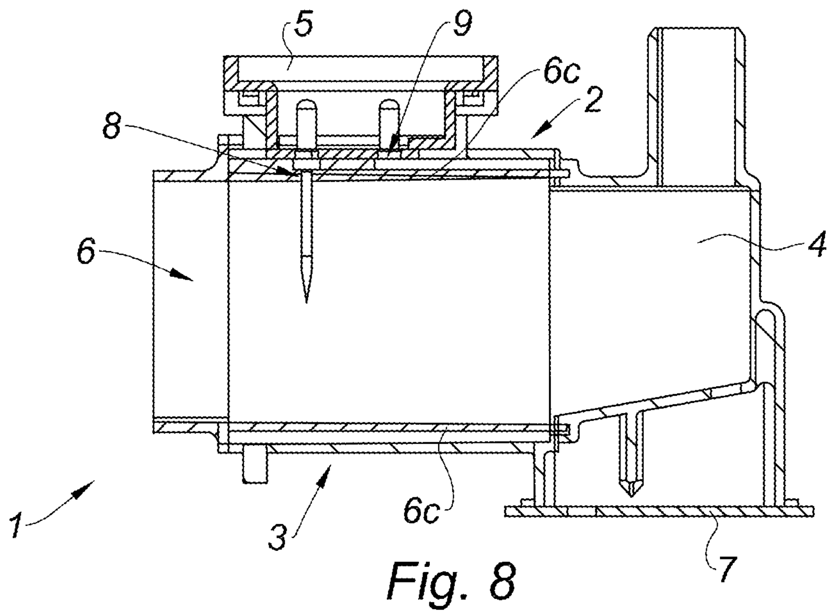
Figure 9:
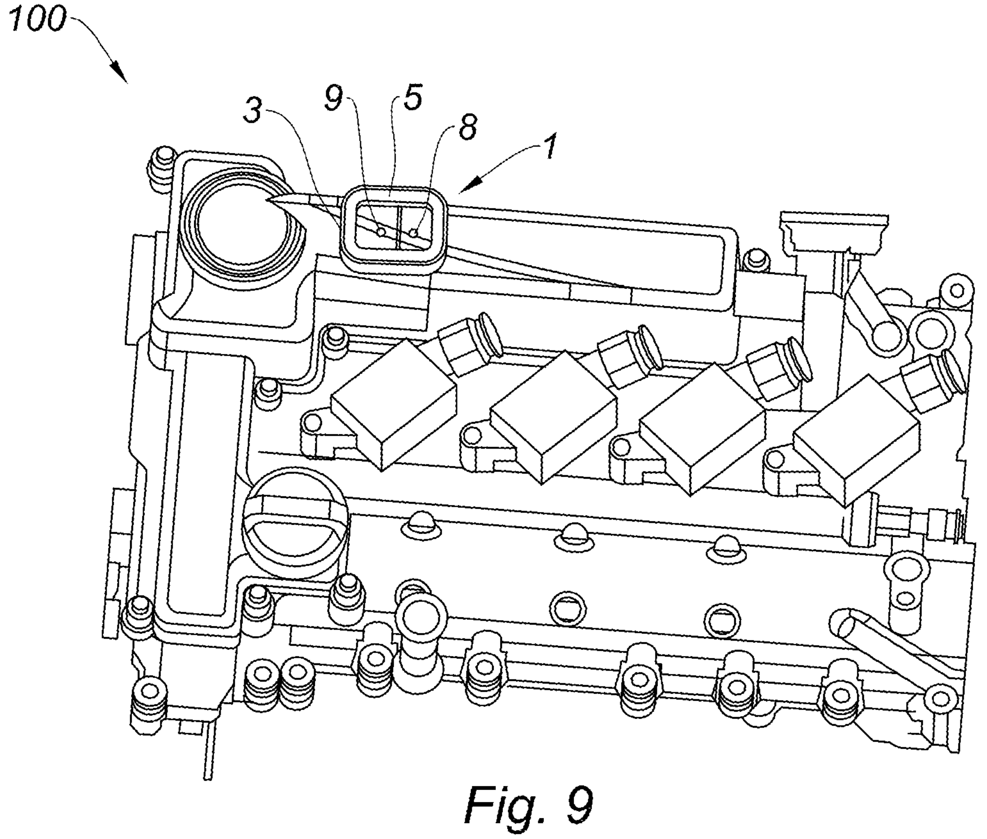
Figure 10:
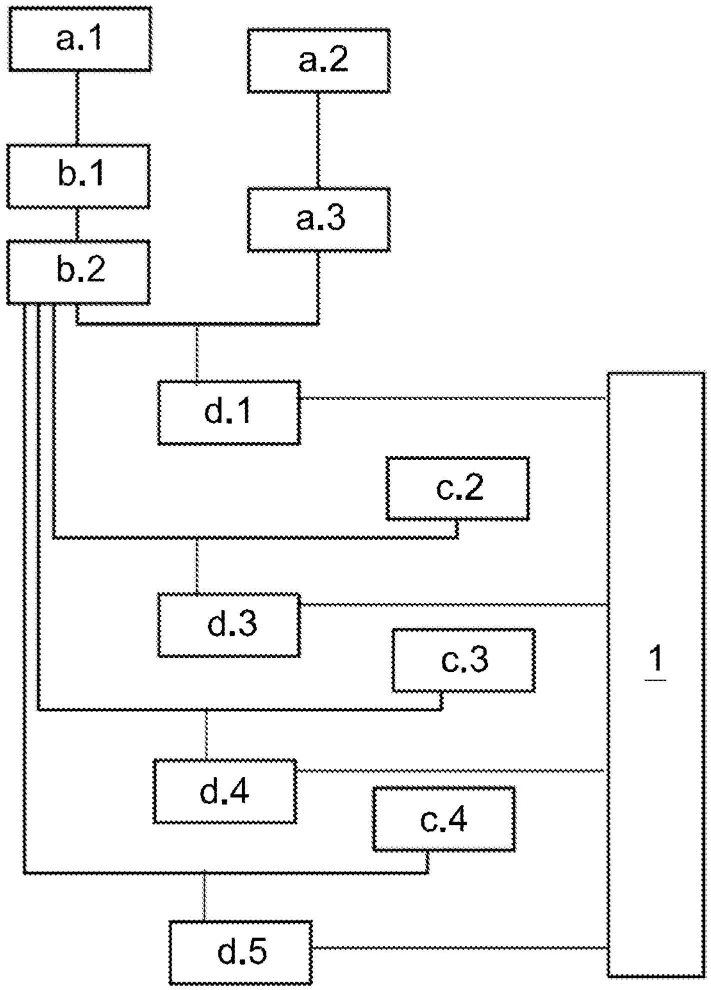
Figure 11:
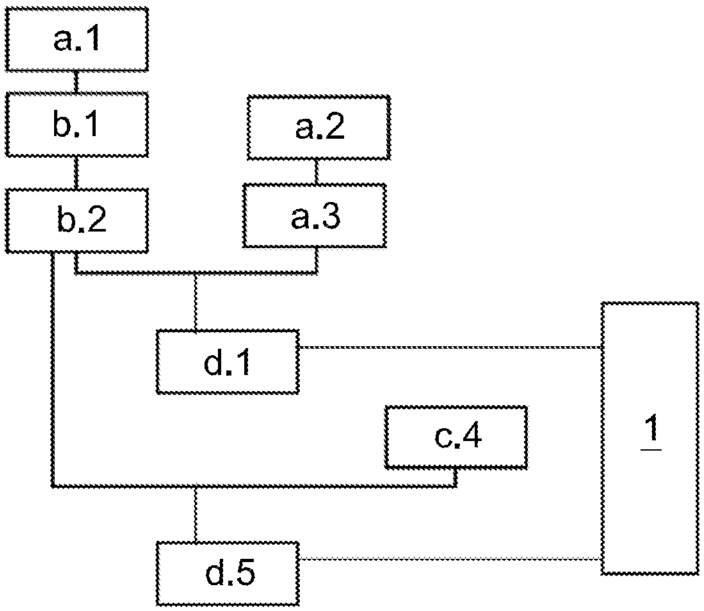
Figure 12:
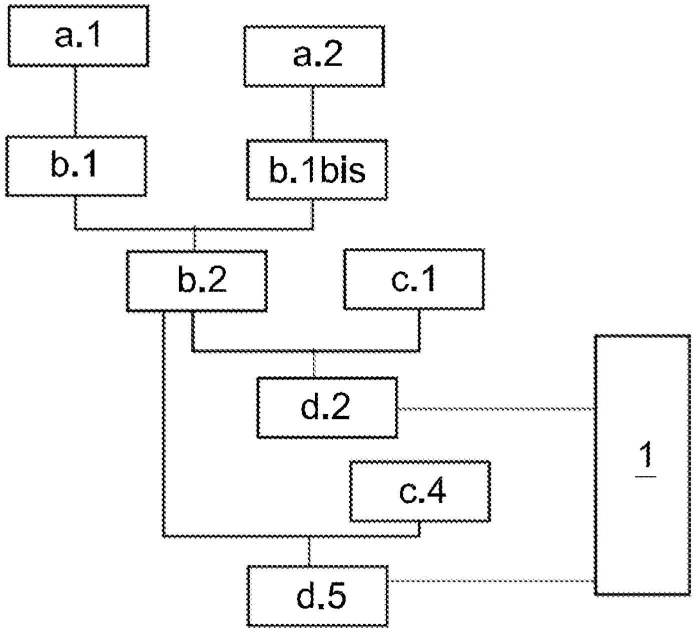

The invention will be better understood, thanks to the description hereinafter, which relates to embodiments according to the present invention, given as non-limiting examples and explained with reference to the appended schematic drawings, in which identical reference numerals correspond to structurally and/or functionally identical or similar elements. The appended schematic figures are listed hereinbelow:

FIG. 1 is a perspective view of the electro-filter according to the invention according to a first embodiment, FIG. 2 is a perspective view of the body of the electro-filter overmolded on the collector electrode (step b.2 of the manufacturing method) according to a variant of the first embodiment, FIG. 3 is a partial detail bottom view of the body of the electro-filter overmolded on the collector electrode according to the variant of the first embodiment, FIG. 4 is an exploded perspective view of the electro-filter according to the first embodiment, FIG. 5 is a perspective view of the emitter electrode and of the collector electrode made according to steps a.1 and a.2 of the manufacturing method according to the invention, FIG. 6 is a perspective view of a portion of the body of the electro-filter overmolded on the electrodes according to a second embodiment, FIG. 7 is a perspective view of the electro-filter according to a second embodiment, FIG. 8 illustrates a sectional view of the electro-filter according to the first embodiment, FIG. 9 illustrates an engine head cover forming at least partially the electro-filter according to the invention, FIG. 10 is a schematic view of the steps of the manufacturing method of the first embodiment, FIG. 11 is a schematic view of the steps of the manufacturing method of the variant of the first embodiment, FIG. 12 is a schematic view of the steps of the manufacturing method of the second embodiment.

Regardless of the embodiment, the electro-filter 1 according to the invention is configured to separate a mixture of gas and oil drops originating from an internal combustion engine. The electro-filter 1 comprises a body 2 including at least one oil/gas separation chamber 3, an oil recovery chamber 4.

Regardless of the embodiment, the separation chamber 3 and the recovery chamber 4 are made of an electrically-insulating plastic material.

Furthermore, and regardless of the embodiment, the electro-filter 1 comprises at least one emitter electrode 8 positioned in the separation chamber 3 of the body 2, and at least one collector electrode 9 positioned in the separation chamber 3 of the body 2.

Regardless of the embodiment, and as illustrated in FIG. 4, the emitter electrode 8 comprises a jumper **8*a*, a point 8*c* and a retaining member 8*b* configured to cooperate with a complementary retaining member 6*b* formed on a portion of the body 2 and more particularly on the connecting part 6** which will be detailed later on.

Furthermore and regardless of the embodiment, the collector electrode 9 is in the form of an open box deprived of a front face and rear face as illustrated in FIGS. 4 and 5, so that the gas to treat passes inside the collector electrode and is ionized by the point-shaped emitter electrode. More particularly, the two plates **9*a*, 9*b* of the collector electrode 9 are connected to each other by a top face on which is formed a jumper 9*c*** protruding from the top face and a bottom face opposite to the top face.

Advantageously, a recess is formed on the top face and opening into the enclosure **9*d* of the collector electrode 9**.

Regardless of the embodiment, the collector electrode 9 is made of an electrically-conductive plastic material, for example a polyamide charged with carbon fibers.

Regardless of the embodiment, the emitter electrode 8 is made of an electrically-conductive plastic material, for example a polyamide charged with carbon fibers.

Regardless of the embodiment, the electro-filter 1 further comprises a gas inlet connecting part 6 intended to cooperate with a conduit conveying the gas to treat (not represented) and shown in FIGS. 1, 2, 4, 6 and 7. Preferably, the connecting part 6 is made of an electrically-insulating plastic material. The connecting part 6 comprises a gas inlet 6*a* intended to cooperate with a conduit. Furthermore and as shown in FIG. 4, the connecting part 3 comprises two branches 6*c* arranged on either side of the inlet 6*a*. One of the branches 6*c* is provided with a complementary retaining member 6*b* intended to cooperate with the retaining member 8*b* of the emitter electrode 8. Once assembled and overmolded, the branches 6*c* of the connecting part 6 are arranged in the separation chamber 3 as illustrated in FIG. 8. Advantageously, the two branches 6*c* of the connecting part 6 are placed inside the open parallelepiped forming the collector electrode in contact with the top face and the bottom face of the collector electrode 9, which allows avoiding the top face and the bottom face of the collector electrode 9 collecting the oil drops. Thus, the oil is collected only on the lateral plates 9*a*, 9*b* of the collector electrode 9, which allows controlling the oil collection location by making the collected oil run in the form of a film or trickle by the effect of gravity and the speed of the gas flow on the plates 9*a*, 9*b*. Thanks to the control of oil collection, it is easier to position the oil outlet orifice 7*b*.

Regardless of the embodiment, the electro-filter 1 comprises a housing 5 intended to house a generator intended to be in connection with the emitter 8 and collector 9 electrodes. More particularly, the separation chamber 3 comprises a receiving element 3*a*, as shown in FIG. 4, shaped so as to receive the housing 5. The housing 5 comprises a cooperation portion 5*b* cooperating with the receiving element 3*a* of the separation chamber 3 and a circumferential retaining flange 5*a* intended to receive the generator (not represented). Preferably, the housing 5 is made of an electrically-insulating plastic material.

Regardless of the embodiment, the electro-filter 1 further comprises a cap 7 comprising an oil return 7*a* or oil outlet conduit. The cap 7 is shaped so as to close the oil recovery chamber 4. The cap 7 comprises an outlet orifice 7*b* fluidly connecting the recovery chamber 4 with the oil return 7*a* as illustrated in FIG. 4.

Regardless of the embodiment, at least the body 2 of the electro-filter 1 according to the invention forms a portion of the walls of a head cover 100 as illustrated in FIG. 9.

The electro-filter 1 according to the invention may be made in various manners. The figures illustrate two possible embodiments but other non-illustrated embodiments are also possible.

The first embodiment and the variant of the first embodiment will now be described according to the diagrams of FIGS. 10 and 11 and with reference to FIGS. 1 to 4.

To manufacture the electro-filter 1 according to the first embodiment, a first injection cycle A is implemented during which a collector electrode 9 is injected into a first cavity of a mold according to an injection step a.1. In parallel (subsequently, anteriorly, or simultaneously), an emitter electrode 8 is injected into another mold or into a third cavity of the same mold according to an injection step a.2. Then, the emitter electrode 8 is removed from the mold in which it has been injected according to the removal step a.3 and in parallel (subsequently, anteriorly, or simultaneously), the collector electrode 9 is displaced into a second cavity of the mold according to a displacement step b.1. Afterwards, according to an overmolding cycle B, the separation chamber 3 and the recovery chamber 4 of the body 2 are overmolded in the second cavity of the mold and on the collector electrode 9 according to the overmolding step b.2.

Alternatively to this first embodiment and as illustrated in FIGS. 2 and 3, the separation chamber 3, the recovery chamber 4, the housing 5, the connecting part 6 of the body 2 are overmolded in the second cavity of the mold and on the collector electrode 9 according to the overmolding step b.2.

According to the first embodiment and according to a second injection cycle C, the housing 5 is obtained by a plastic injection step c.3 carried out in parallel (subsequently, anteriorly, or simultaneously) to the first injection cycle A or to the overmolding cycle B. Furthermore, the connecting part 3 is obtained by a plastic injection step c.2 carried out in parallel (subsequently, anteriorly, or simultaneously) to the first injection cycle A or to the overmolding cycle B. Furthermore, the cap 7 is obtained by a plastic injection step c.4 carried out in parallel (subsequently, anteriorly, or simultaneously) to the first injection cycle A or to the overmolding cycle B. The injection steps (c.2, c.3, c.4) may be carried out consecutively or simultaneously.

Afterwards, according to the first embodiment, an assembly cycle D is implemented, in which are assembled by bonding or welding, or clipping, the housing 5 (step d.4), the connecting part 6 (step d.3), the cap 7 (step d.5) and the emitter electrode 8 (step d.1) on the overmolded body 2. The assembly steps (d.1, d.3, d.4, d.5) may be carried out consecutively or simultaneously.

According to the variant of the first embodiment, after overmolding, an assembly cycle D is implemented, in which are assembled by bonding or welding, or clipping, the emitter electrode 8 (step d.1) and the cap 7 (step d.5), the cap 7 being obtained by a plastic injection step c.4 carried out in parallel (subsequently, anteriorly, or simultaneously) to the first injection cycle A or to the overmolding cycle B. The assembly steps (d.1, d.5) may be carried out consecutively or simultaneously.

The second embodiment will now be described according to the diagram of FIG. 12 and with reference to FIGS. 5 to 7.

To manufacture the electro-filter 1 according to the second embodiment, a first injection cycle A is implemented during which a collector electrode 9 is injected into a first cavity of a mold according to an injection step a.1. In parallel (subsequently, anteriorly, or simultaneously), an emitter electrode 8 is injected into a third cavity of the same mold according to an injection step a.2. Then, the collector electrode 9 is displaced into a second cavity of the mold according to a displacement step b.1 and the emitter electrode 8 is displaced into the second cavity of the mold according to a displacement step b.1bis. Afterwards, according to an overmolding cycle B, the separation chamber 3, the housing 5 and the connecting part 6 are overmolded in the second cavity of the mold and on the collector electrode 9 and the emitter electrode 8 according to the overmolding step b.2.

According to the second embodiment, a second injection cycle C is implemented in which, the cap 7 is obtained by a plastic injection step c.4 in parallel (subsequently, anteriorly, or simultaneously) to the first injection cycle A or to the overmolding cycle B, and the recovery chamber 4 is obtained by a plastic injection step c.1 carried out in parallel (subsequently, anteriorly, or simultaneously) to the first injection cycle A or to the overmolding cycle B. The injection steps (c.1, c.4) may be carried out consecutively or simultaneously.

Afterwards, an assembly cycle D is implemented, in which are assembled by bonding or welding, or clipping, the recovery chamber 4 (step d.2), the cap 7 (step d.5) on the overmolded body 2. The assembly steps (d.2, d.5) may be carried out consecutively or simultaneously.

Of course, the invention is not limited to the embodiments described and shown in the appended figures. Modifications remain possible, in particular with regard to the constitution of the various elements or by substitution with technical equivalents, without departing from the scope of the invention.

The invention claimed is:

1. A method for manufacturing an electro-filter for separating a mixture of gas and oil drops originating from an internal combustion engine, said electro-filter comprising:

at least one body including at least one oil/gas separation chamber;

at least one emitter electrode; and at least one collector electrode made of an electrically-conductive plastic material, the manufacturing method comprising:

implementation of a first injection cycle comprising injecting the at least one collector electrode with the electrically-conductive plastic material into a first cavity of a mold, implementation of an overmolding cycle comprising:

displacing the at least one injected collector electrode into a second cavity of the same mold or into a cavity of another mold; and overmolding the at least one oil/gas separation chamber of the at least one body at least on the at least one injected collector electrode with an electrically-insulating plastic material.

2. The manufacturing method according to claim 1, wherein the overmolding cycle for forming a first electro-filter is carried out at the same time as the first cycle of injecting the at least one collector electrode for formation of a second electro-filter.

3. The manufacturing method according to claim 1, wherein the first injection cycle comprises injecting the at least one emitter electrode into a third cavity with an electrically-conductive plastic material.

4. The manufacturing method according to claim 3, further comprising removing the at least one injected emitter electrode from the mold or displacing the at least one injected emitter electrode into the second cavity of the mold.

5. The manufacturing method according to claim 4, wherein the at least the separation chamber is overmolded on the at least one emitter electrode and the at least one collector electrode in the second cavity of the mold.

6. The manufacturing method according to claim 1, further comprising implementing a second injection cycle simultaneously or subsequently or anteriorly to the first injection cycle or to the overmolding cycle.

7. The manufacturing method according to claim 1, further comprising implementing at least one assembly cycle implemented subsequently at least to the overmolding cycle.

8. The manufacturing method according to claim 7, wherein the assembly cycle comprises assembling the at least one emitter electrode with the overmolded body of the electro-filter.

* * * * *